United States Patent
Yang et al.

(10) Patent No.: US 7,388,701 B2
(45) Date of Patent: Jun. 17, 2008

(54) OPTICAL MODULATOR

(75) Inventors: Jeong-Suong Yang, Suwon-si (KR); Yun-Jin Ko, Seoul (KR); Jong-Hyeong Song, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 54 days.

(21) Appl. No.: 11/639,987

(22) Filed: Dec. 15, 2006

(65) Prior Publication Data

US 2007/0146859 A1    Jun. 28, 2007

(30) Foreign Application Priority Data

Dec. 26, 2005  (KR) ............... 10-2005-0129468
Oct. 9, 2006   (KR) ............... 10-2006-0097914

(51) Int. Cl.
G02B 26/06 (2006.01)

(52) U.S. Cl. ............ 359/224; 359/291; 359/318; 359/847

(58) Field of Classification Search .......... 359/223, 359/224, 290, 291, 318, 847, 849, 872, 883
See application file for complete search history.

(56) References Cited

U.S. PATENT DOCUMENTS 6,379,510 B1 *  4/2002  Kane et al. ............ 204/192.34
2005/0063038 A1 *  3/2005  Filhol ........................ 359/291

* cited by examiner

Primary Examiner—Hung X. Dang
Assistant Examiner—Joseph Martinez
(74) Attorney, Agent, or Firm—Christensen O'Connor Johnson Kindness PLLC

(57) ABSTRACT

An optical modulator having a junction layer is disclosed. An optical modulator may be provided which includes a substrate, an insulation layer positioned on the substrate, a ribbon layer positioned with an intermediate portion spaced apart from the insulation layer by a predetermined distance, a protective layer positioned on both ends of the ribbon layer, a junction layer positioned on the protective layer which has an adhesive property and which prevents the diffusion of gas, and a piezoelectric element joined with the protective layer by way of the junction layer interposed in-between which moves the intermediate portion of the ribbon layer toward and away from the substrate. In certain embodiments of the invention, the light diffraction property and reliability of the overall optical modulator can be maximized, by positioning a junction layer, having improved adhesion and capable of preventing the diffusion of oxygen, on the lower surface of the piezoelectric elements.

5 Claims, 7 Drawing Sheets

OPTICAL MODULATOR

CROSS-REFERENCE TO RELATED APPLICATIONS

This application claims the benefit of Korean Patent Application No. 10-2005-0129468 filed with the Korean Intellectual Property Office on Dec. 26, 2005, and Korean Patent Application No. 10-2006-0097914 filed with the Korean Intellectual Property Office on Oct. 9, 2006, the disclosures of which are incorporated herein by reference in their entirety.

BACKGROUND

1. Technical Field

The present invention relates to a MEMS structure and a manufacturing method thereof, more particularly, to an optical modulator and a manufacturing method thereof.

2. Description of the Related Art

MEMS refers to a microelectromechanical system or element, which is a technology that uses semiconductor manufacturing technology to form three-dimensional structures on silicon substrates. There are a variety of applications in which MEMS is used, an example of which is the field of optics. Using MEMS technology allows the manufacture of optical components smaller than 1 mm, by which micro-optical systems can be implemented. Micro-optical components such as optical modulators and micro-lenses, etc., corresponding to a micro-optical system, is selected for application in telecommunication devices, displays, and recording devices, due to such advantages as quick response time, low level of loss, and convenience in layering and digitalizing.

The optical modulator is a circuit or device which loads signals on a beam of light (optical modulation) when the transmission medium is optical fiber or free space in the optical frequency range. The optical modulator can be divided mainly into a direct type, which directly controls the on/off state of light, and an indirect type, which uses reflection and diffraction, where the indirect type may further be divided into an electrostatic type and a piezoelectric type according to how it is operated.

Regardless of its operation type, the indirect type optical modulator performs optical modulation by means of interference occurring due to the differences in paths between lights reflected or diffracted on different surfaces. In particular, a piezoelectric type optical modulator generates differences in paths of reflected light using the operating power of piezoelectric elements, which contract and expand according to a predetermined voltage supplied to the optical modulator (refer to descriptions for FIGS. 5 and 6). Thus, in a piezoelectric type optical modulator, the piezoelectric elements play an especially important role in implementing its light diffraction properties.

However, in prior art, extended periods of use of the optical modulator may cause separation at the interface (see portion of FIG. 1 indicated by dotted lines) between a piezoelectric element and the LTO layer (low temperature oxide layer) formed at the lower portion (i.e. the lower portion of the lower electrode) of the piezoelectric element, to create defects in the optical modulator (see portion of FIG. 2 indicated by dotted lines). This is because the conventional Ti thin film, stacked as a junction layer for adhesion between the LTO layer and the lower electrode, becomes degraded with extended periods of use. The 'c' portion within the portion indicated by dotted lines in FIG. 2 show a piezoelectric element that has not been separated from the LTO layer (the entire 'c' portion of FIG. 2 displays a dark yellow color), while the 'a' and 'b' portions within the portion indicated by dotted lines in FIG. 2 shows parts of the piezoelectric elements separated from the LTO layers (parts of the 'a' and 'b' portions of FIG. 2 display a white color). Here, portions 'a' through 'c' show the positions where piezoelectric elements are formed.

Also, the conventional Ti thin film has a tendency of becoming oxidized by the oxygen diffused during the high-temperature RTA (rapid thermal annealing) process for stacking a piezoelectric layer, performed after the process for forming the lower electrode. Thus, as the Ti thin film is oxidized by the diffused oxygen, it is more easily separated from the LTO layer.

The degrading of the Ti thin film as described above causes a degrading of the overall piezoelectric element, and is consequently detrimental to the light diffraction property and reliability of the optical modulator.

SUMMARY

Thus, certain aspects of the invention aim to provide an optical modulator and a manufacturing method thereof, which maximize the light diffraction property and reliability of the optical modulator.

Also, certain aspects of the invention aim to provide an optical modulator and a manufacturing method thereof, which include a junction layer having improved adhesive power in order to prevent the degrading of the operating properties of piezoelectric elements in the optical modulator.

Further, certain aspects of the invention aim to provide an optical modulator and a manufacturing method thereof, which include a junction layer capable of preventing oxidation due to the diffusion of oxygen, etc., in order to maximize the operating properties of the piezoelectric elements.

These and other aspects of the invention will readily be understood by the description provided below.

One aspect of the invention may provide an optical modulator including a substrate, an insulation layer positioned on the substrate, a ribbon layer positioned with an intermediate portion spaced apart from the insulation layer by a predetermined distance, a protective layer positioned on both ends of the ribbon layer, a junction layer positioned on the protective layer which has an adhesive property and which prevents the diffusion of gas, and a piezoelectric element joined with the protective layer by way of the junction layer interposed in-between which moves the intermediate portion of the ribbon layer toward and away from the substrate.

An optical modulator according to an embodiment of the invention may further include a sacrificial layer which is positioned between the insulation layer and the ribbon layer and which supports the ribbon layer. Here, a portion of the sacrificial layer located at an intermediate portion of the ribbon layer may be removed, to be spaced apart from the insulation layer by a predetermined distance.

Also, the piezoelectric element used in an embodiment of the invention may include a lower electrode, a piezoelectric layer positioned on the lower electrode, and an upper electrode positioned on the piezoelectric layer, where the piezoelectric layer contracts or expands in correspondence to a predetermined voltage to generate an operating power for moving the intermediate portion of the ribbon layer toward and away from the substrate.

The junction layer may include at least one material selected from a group consisting of $Al_2O_3$, $TiO_2$, TiN, TiSiN, TaN, TaSiN, $Ta_2O_3$, $Ta_2O_5$, and WN, and the junction layer may be configured to prevent the diffusion of oxygen.

Additional aspects and advantages of the present invention will be set forth in part in the description which follows, and in part will be obvious from the description, or may be learned by practice of the invention.

DETAILED DESCRIPTION

Certain embodiments of the invention will be described below in more detail with reference to the accompanying drawings. Here, those components are rendered the same reference number that are the same or are in correspondence, regardless of the figure number, and redundant explanations are omitted. Detailed descriptions will not be provided for related prior art, when it is deemed that such detailed descriptions may obscure the essence of the invention.

Figure 3:
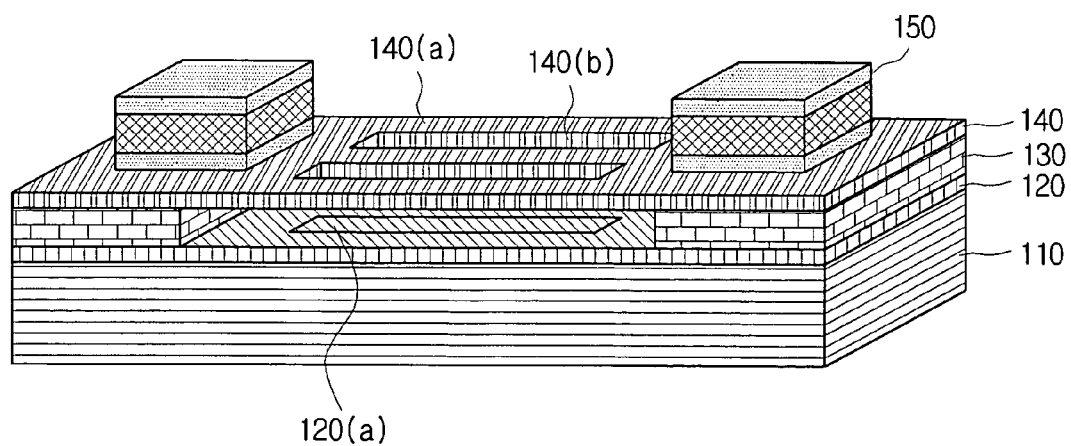
FIG. 3 is a perspective view of a piezoelectric type optical modulator applicable to an embodiment of the invention.
Figure 4:
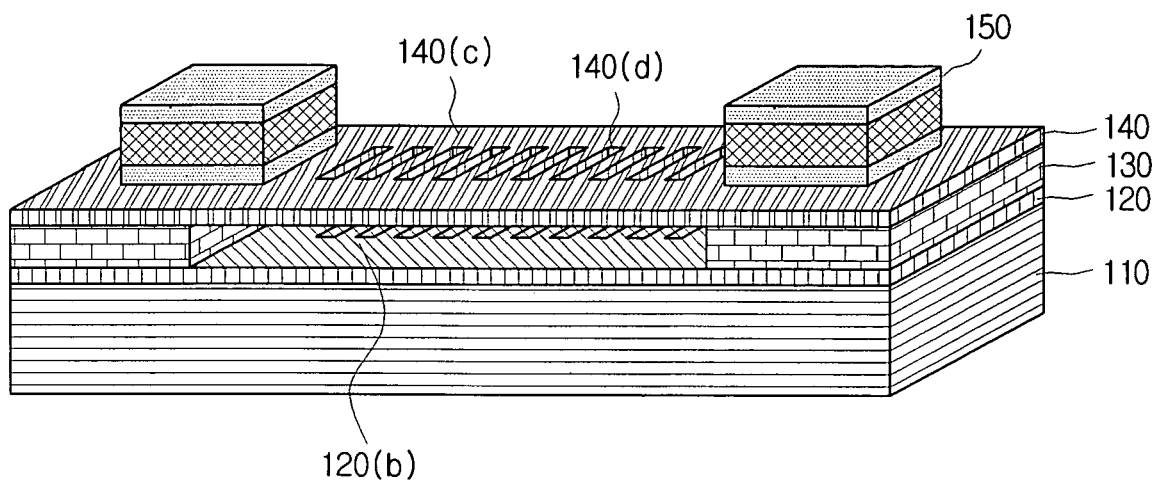
FIG. 4 is a perspective view of another piezoelectric type optical modulator applicable to an embodiment of the invention.

The piezoelectric type optical modulator applicable to embodiments of the invention will first be described before discussing the embodiments of the invention FIG. 3 is a perspective view of a piezoelectric type optical modulator applicable to an embodiment of the invention, and FIG. 4 is a perspective view of another piezoelectric type optical modulator applicable to an embodiment of the invention.

Referring to FIGS. 3 and 4, the piezoelectric type optical modulator includes a substrate 110, an insulation layer 120, a sacrificial layer 130, a ribbon layer 140, and piezoelectric elements 150. The ribbon layer 140 has a plurality of holes 140(b), 140(d) in its intermediate portion. In addition, an upper reflective layer 140(a), 140(c) may be formed on the rest of the intermediate portion of the ribbon layer 140 that is not occupied by the holes, and a lower reflective layer 120(a), 120(b) may be formed on the insulation layer 120 in correspondence with the plurality of holes. The piezoelectric elements 150 control the ribbon layer 140 to bend toward and away from the substrate 110, according to the degree of up/down or left/right contraction and expansion generated by the voltage difference between upper and lower electrodes.

Each part of the optical modulator will be described later in more detail with reference to FIG. 7. The following descriptions for FIGS. 5 and 6 will concentrate on the principles of optical modulation according to changes in distance between the ribbon layer 140 and the insulation layer 120.

Figure 5:
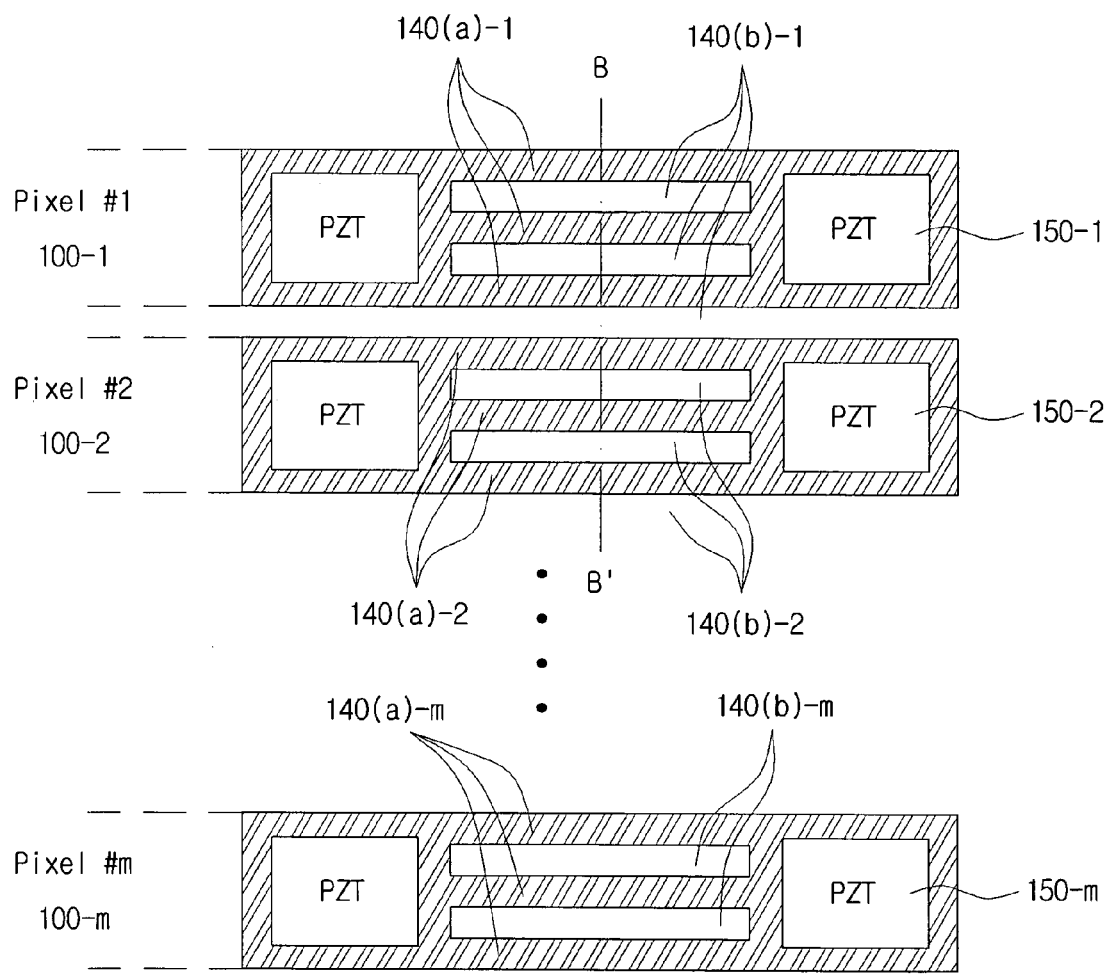
FIG. 5 is a plan view of an optical modulator array composed of optical modulators such as that shown in FIG. 3.

FIG. 5 is a plan view of an optical modulator array composed of optical modulators such as that shown in FIG. 3, and FIGS. 6(a)-6(b) are diagrams illustrating the principles of optical modulation in the optical modulator array of FIG. 5. Here, FIGS. 6(a)-6(b) show a cross-sectional view across line B-B' of FIG. 5.

Referring to FIG. 5, the optical modulator array is composed of an m number of micromirrors 100-1, 100-2, ..., 100-m, each responsible for pixel #1, pixel #2, ..., pixel #m, respectively. The optical modulator array deals with image information with respect to one-dimensional images of vertical or horizontal scanning lines (Here, it is assumed that a vertical or horizontal scanning line consists of an m number of pixels.), while each micromirror 100-1, 100-2, ..., 100-m deals with one pixel among the m pixels constituting the vertical or horizontal scanning line. Thus, the light reflected and diffracted by each micromirror is later projected by an optical scanning device as a two-dimensional image on a screen. For example, in the case of VGA 640*480 resolution, modulation is performed 640 times on one surface of an optical scanning device (not shown) for 480 vertical pixels, to generate 1 frame of display per surface of the optical scanning device. Here, a polygon mirror, a rotating bar, or a galvano mirror, etc., may be used for the optical scanning device.

While the description below of the principle of optical modulation concentrates on pixel #1, it is obvious that the same may apply to other pixels.

In the present embodiment, it is assumed that the number of holes 140(b)-1 formed in the ribbon layer 140 is two, as shown in FIG. 3. Because of the two holes 140(b)-1, there are three upper reflective layers 140(a)-1 formed on the upper portion of the ribbon layer 140. On the insulation layer 120, two lower reflective layers are formed in correspondence with the two holes 140(b)-1. Also, there is another lower reflective layer formed on the insulation layer 120 in correspondence with the gap between pixel #1 and pixel #2. Thus, there are an equal number of upper reflective layers 140(a)-1 and lower reflective layers 120(a)-1 per pixel, and it is possible to control the luminosity of the modulated light using 0-order diffracted light or ±1-order diffracted light.

Figure 6:
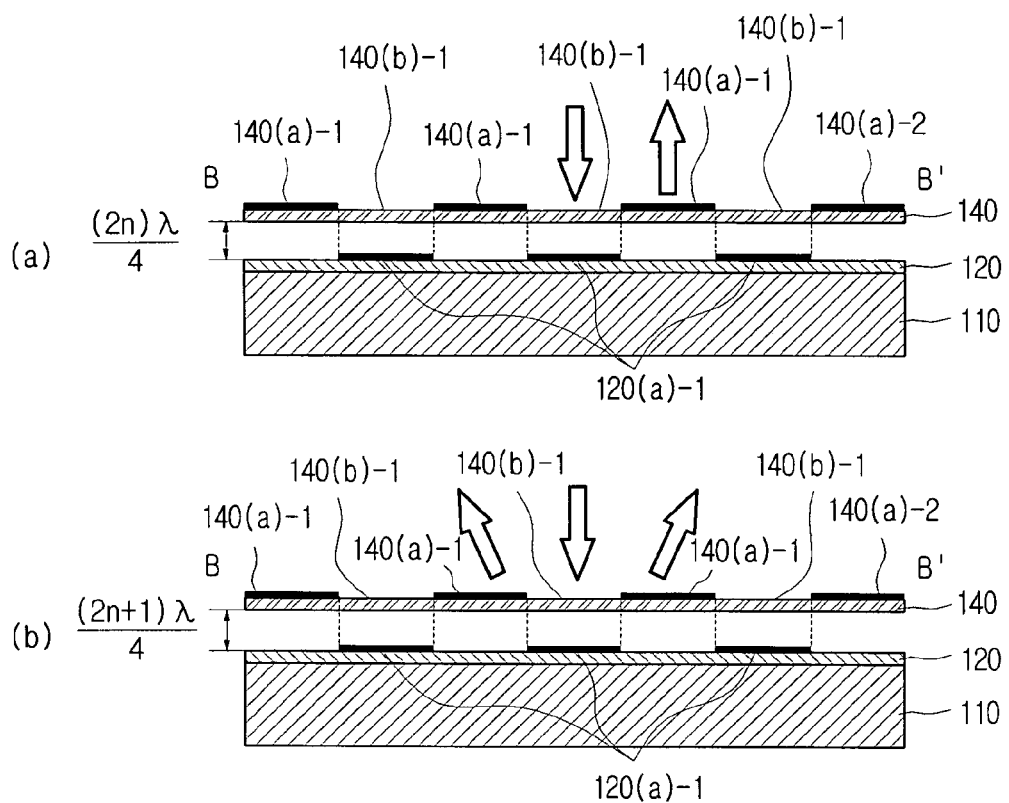
FIGS. 6(a) and 6(b) are diagrams illustrating the principles of optical modulation in the optical modulator array of FIG. 5.

Referring to FIG. 6, in the case where the wavelength of a beam of light is λ, a first voltage is applied to the piezoelectric elements 150 that makes the distance substantially equal to $(2n)\lambda/4$ (wherein n is a natural number) between the ribbon layer 140, on which an upper reflective layer 140(a) is formed, and the insulation layer 120, on which a lower reflective layer 120(a) is formed (see FIG. 6(a)). Here, in the case of a 0-order diffracted (reflected) beam of light, the overall path length difference between the light reflected by the upper reflective layer 140(a) and the light reflected by the lower reflective layer 120(a) is equal to nλ, so that constructive interference occurs, and the diffracted light has its maximum luminosity. In the case of +1 or −1 order diffracted light, however, the luminosity of the light is at its minimum value due to destructive interference.

Also, a second voltage is supplied to the piezoelectric elements 150 that makes the distance substantially equal to (2n+1)λ/4 (wherein n is a natural number) between the ribbon layer 140, on which an upper reflective layer 140(a) is formed, and the insulation layer 120, on which a lower reflective layer 120(a) is formed (see FIG. 6(b)). Here, in the case of a 0-order diffracted (reflected) beam of light, the overall path length difference between the light reflected by the upper reflective layer 140(a) and the light reflected by the lower reflective layer 120(a) is equal to (2n+1)λ/2, so that destructive interference occurs, and the diffracted light has its minimum luminosity. In the case of +1 or −1 order diffracted light, however, the luminosity of the light is at its maximum value due to constructive interference.

As a result of such interferences, the optical modulator can load signals on the beams of light by controlling the quantity of the reflected or diffracted light. While the foregoing describes the cases in which the distance is (2n)λ/4 or (2n+1)λ/4 between the ribbon layer 140, on which an upper reflective layer 140(a) is formed, and the insulation layer 120, on which a lower reflective layer 120(a) is formed, it is to be appreciated that a variety of embodiments may be applied with regards the present invention, which are operated with gaps capable of controlling the intensity of interference by diffraction and reflection.

Figure 7:
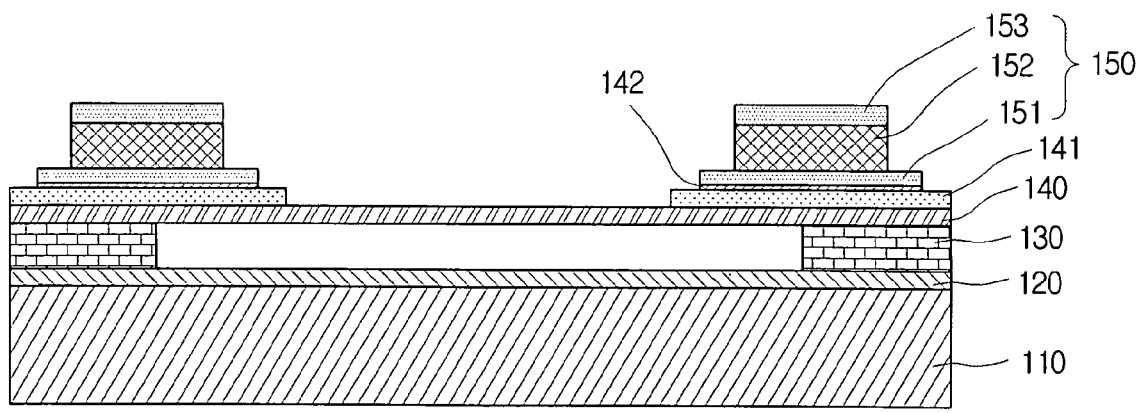
FIG. 7 is a side-elevational view illustrating the structure of an optical modulator based on an embodiment of the invention.

FIG. 7 is a side-elevational view illustrating the structure of an optical modulator based on an embodiment of the invention.

Referring to FIG. 7, the optical modulator includes a substrate 110, an insulation layer 120, a sacrificial layer 130, a ribbon layer 140, a protective layer 141, a junction layer 142, and piezoelectric elements 150.

The substrate 110 may be a typical semiconductor substrate, and may be made from a material such as silicon (Si), alumina (Al2O3), zirconia (ZrO2), quartz, or silica (SiO2), etc.

The insulation layer 120 is positioned on the substrate 110. The insulation layer 120 acts as an etch stop layer, and is formed from a material with a high selectivity to the etchant (where the etchant is an etchant gas or an etchant solution) which etches the material used for the sacrificial layer 130. Here, the material used for the insulation layer 120 may be silica (SiO2), etc.

Figure 1:
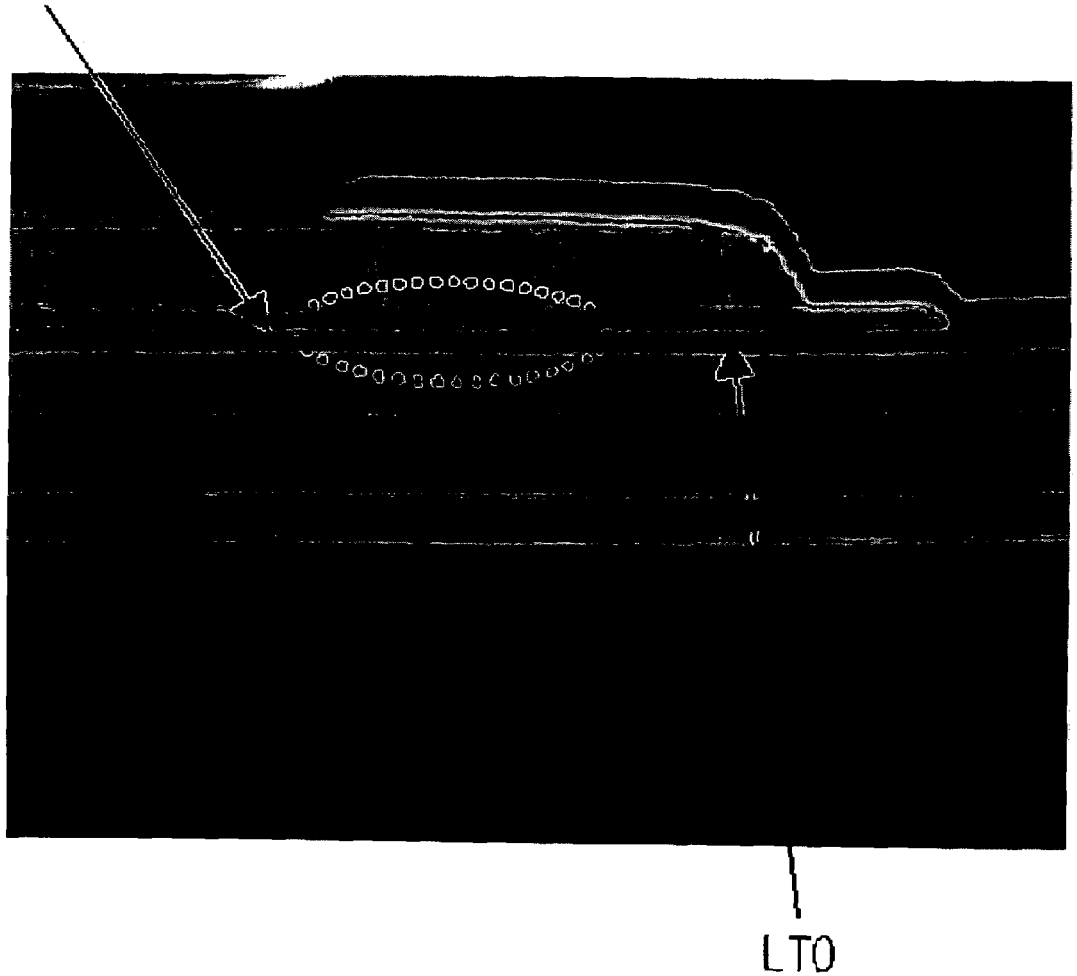
FIG. 1 is a drawing illustrating the interface between a lower electrode and an LTO layer.
Figure 2:
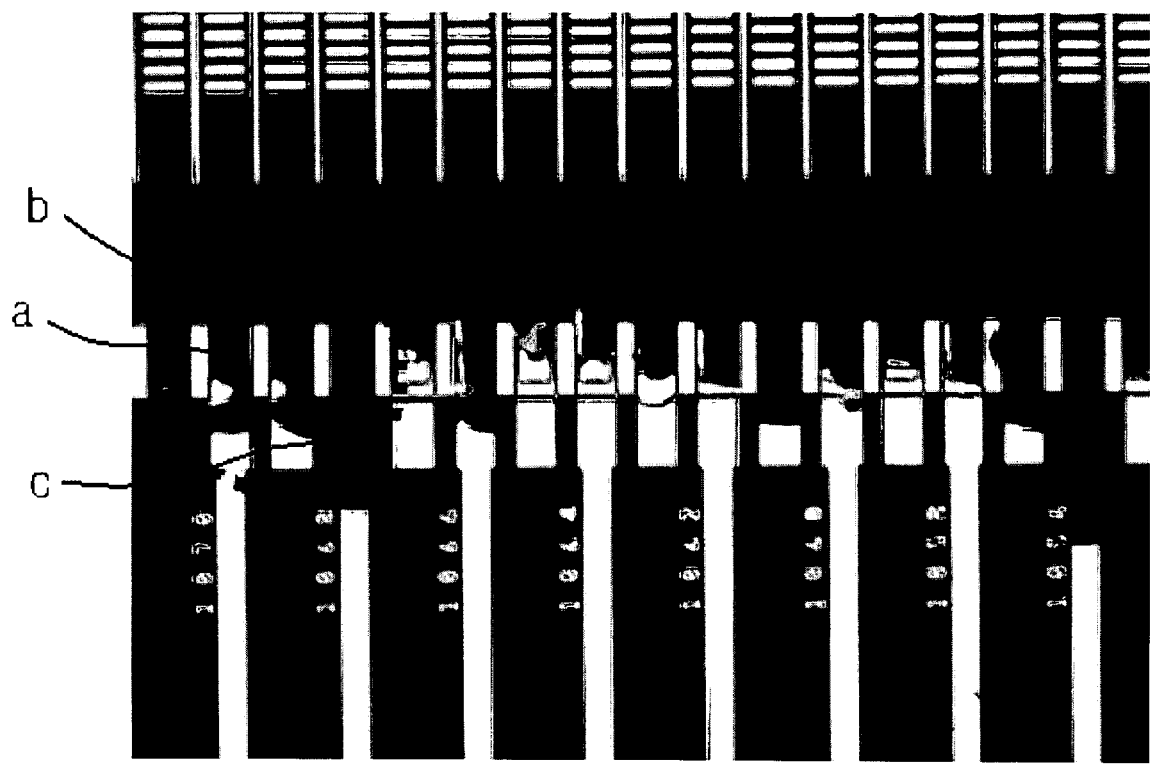
FIG. 2 is a drawing illustrating the interface separation phenomenon in a piezoelectric element of an optical modulator.

Here, a lower reflective layer (for example, 120(a) of FIG. 1 or 120(b) of FIG. 2) capable of reflecting or diffracting light may be formed on the insulation layer 120. Any of a variety of reflective materials may be used for the lower reflective layer, for example, a metal material (such as Al, Pt, Cr, Ag, etc.).

The sacrificial layer 130 is positioned on the insulation layer 120, and may be made from materials such as silicon (Si) or polycrystalline silicon (poly-Si), etc.

After the sacrificial layer 130 is stacked on the insulation layer 120, all or portions of the sacrificial layer 130 may be removed by means of an etching process that will be described later (see FIG. 8(e)). Such an etching process allows the intermediate portion of the ribbon layer 140 to be spaced apart from the insulation layer 120 by a predetermined distance, thereby creating an operating space in-between. Here, the operating space refers to the empty space between the ribbon layer 140 and the insulation layer 120, and because of this operating space, the intermediate portion of the ribbon layer 140, i.e. the ribbon part, is able to move toward and away from the substrate 110 in correspondence to the operating power of the piezoelectric elements 150. The rest of the sacrificial layer 140 that is not removed by the etching process supports the ribbon layer 140.

Here, while only portions of the sacrificial layer 130 are removed, in the optical modulator illustrated in FIG. 7, so that the sacrificial layer 130 is positioned on both ends of the insulation layer 120 to support the ribbon layer 140, it is possible to have all of the sacrificial layer 130 removed by an etching process that will be described later (see FIG. 8(e)). In this case, the sacrificial layer 130 does not support the ribbon layer 140, and only provides the operating space by which the ribbon layer 140 can move toward and away from the substrate 110. In other words, the location of the operating space may vary according to the etching process of the sacrificial layer 130. Obviously, when the location of the operating space is changed, the location of the ribbon part in the ribbon layer 140 may also be changed accordingly.

The ribbon layer 140 is positioned on the sacrificial layer 130. Here, a silicon nitride material (SiXNY), such as Si3N4, may be used for the ribbon layer 140.

Here, an upper reflective layer (for example, 140(a) of FIG. 1 or 140(c) of FIG. 2) capable of reflecting or diffracting light may be formed on the intermediate portion of the ribbon layer 140, i.e. the ribbon part. Any of a variety of reflective materials may be used for the upper reflective layer, for example, a metal material (such as Al, Pt, Cr, Ag, etc.).

The ribbon layer 140 may be selectively etched, by means of a process that will be described later (see FIG. 8(e)), to form a particular shape (in this embodiment, a shape having one or more holes in the intermediate portion of the ribbon layer 140). In this case, the upper reflective layer is formed on portions of the intermediate portion of the ribbon layer 140 where the holes have not been formed.

Figure 9:
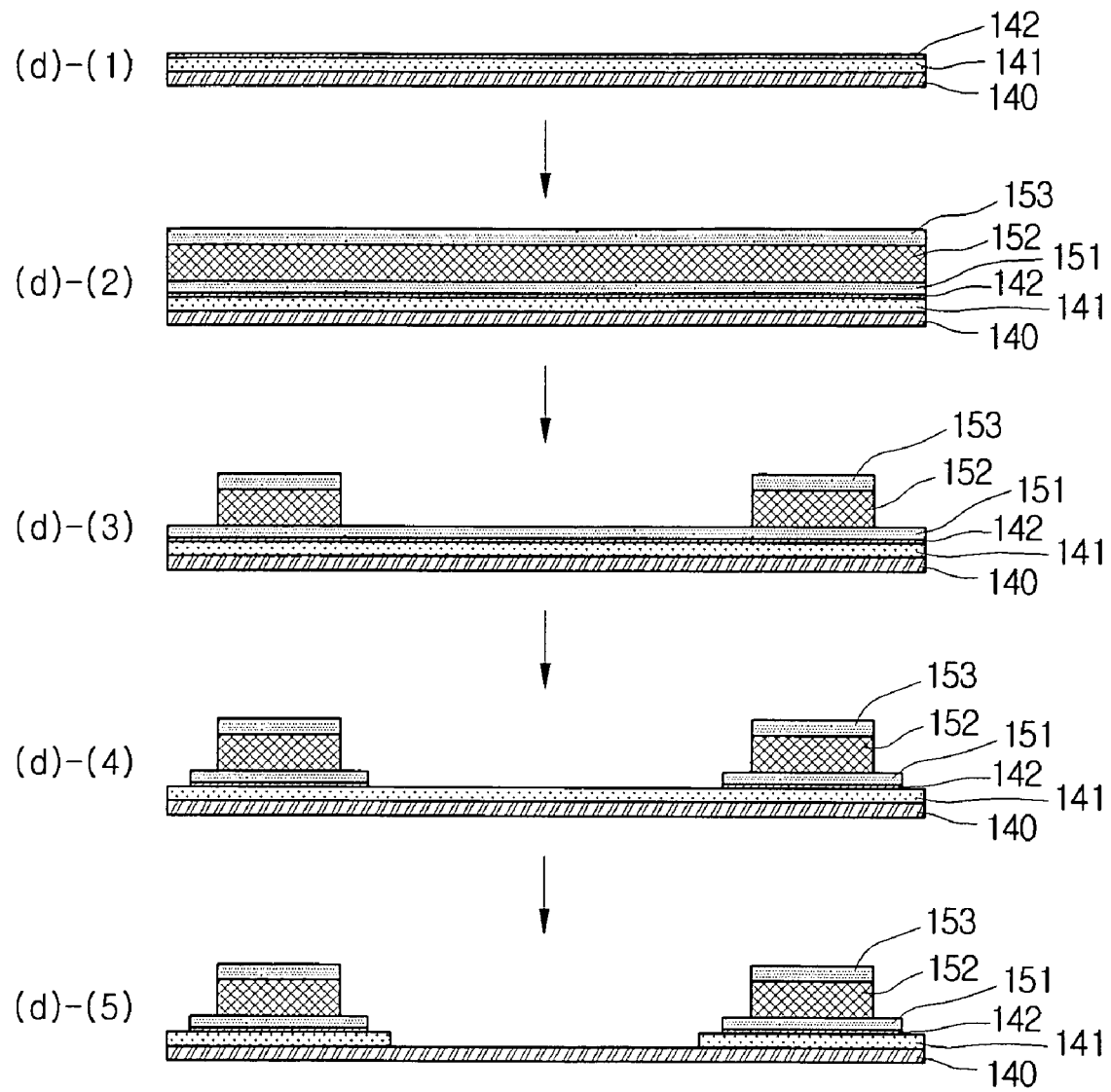
FIGS. 9(d)-(1) through 9(d)-(5) are diagrams illustrating the manufacturing procedure for FIG. 8(d) in more detail.

The protective layer 141 is positioned on both ends of the ribbon layer 140. During the process of etching the lower electrode 151 and the junction layer 142, as will be described later, the protective layer 141 protects the upper surface of the ribbon layer 140, which is located below the lower electrode 151 and the junction layer 142, from being etched (eroded) (see FIG. 9(d)-(4)). The erosion of the upper surface of the ribbon layer 140 may deteriorate the adhesion to the upper reflective layer and may cause separation (peeling) at the interface between the ribbon part and the upper reflective layer. That is, the erosion of the upper surface of the ribbon layer 140 has a detrimental effect on the light-reflective property of the optical modulator. Thus, by having a protective layer 141 on the upper portion of the ribbon layer 140, the erosion is prevented of the upper surface of the ribbon layer 140 during the etching process for the lower electrode 151 and the junction layer 142. Here, an LTO (low temperature oxide) material such as SiO2 may be used for the protective layer 141.

The junction layer 142 is positioned on the protective layer 141. The junction layer 142 joins (attaches) the upper surface of the protective layer 141 with the lower surface of the piezoelectric element 150 (i.e. the lower surface of the lower electrode 151) described later. Since the lower electrode 151 is made of a metal material such as Pt, etc., there is difficulty in attaching it directly onto the protective layer 141, which is made of a material such as SiO2, etc. Thus, by having the junction layer 142 in-between, the adhesion may be improved between the lower surface of the lower electrode 151 and the upper surface of the protective layer 141.

A dielectric material which provides superior adhesion may be used for the junction layer 142, such as Al2O3, TiO2, TiN, TiSiN, TaN, TaSiN, Ta2O3, Ta2O5, and WN, etc.

The method of depositing the junction layer 142 may be a PVD (physical vapor deposition) method, such as sputtering or E-beam evaporation, etc., a CVD (chemical vapor deposition) method, such as MOCVD (metal organic CVD)

or PECVD (plasma enhanced CVD), etc., or an ALD (atomic layer deposition) method, etc.

Here, the sputtering method, which is a PVD method, uses the kinetic energy of a sputtering gas (which is an inert gas such as Ar, etc.) in a plasma phase to make the deposition material adhere to the board undergoing deposition. The E-beam evaporation method uses an electron beam to heat the board undergoing deposition so that the deposition material melts and becomes deposited on the board.

The CVD method is a method that provides superior coating properties, in which two or more deposition materials are mixed in a reaction chamber such that deposition (reaction) occurs on the surface of the board undergoing deposition. Here, the MOCVD method uses a metal organic material of a solid or liquid phase, and the PECVD method uses a deposition material of a plasma phase.

With the ALD method, in particular, a film of a thickness corresponding to a single-atom layer may be formed on the board undergoing deposition, by repeatedly performing chemisorption and desorption on the chemical elements (hereinafter referred to as "sources") composing the deposition material, so that it is a method advantageous in depositing extremely thin films. In the ALD method, the sources (for example, aluminum (Al) and oxygen (O2), when the deposition material is Al2O3) are injected in order one by one to induce a chemical reaction on the surface of the board undergoing deposition.

That is, a first source (e.g. aluminum) is injected for a predetermined duration of time into a deposition chamber containing the board undergoing deposition (in this example, the protective layer 141) so that it is chemisorbed onto the board undergoing deposition, and a second source (e.g. oxygen) is injected for a predetermined duration of time into the deposition chamber so that it reacts with the first source chemisorbed on the board undergoing deposition, whereby the deposition material (e.g. Al2O3) may be deposited on the board undergoing deposition. This process is repeated until the layer reaches a desired deposition thickness. Here, the injection of a source into the deposition chamber may be achieved by injecting the source itself (e.g. oxygen (O2) gas) or by injecting a material that can supply the source within the deposition chamber (e.g. water (H2O), etc., when the source to be injected is oxygen (O2)).

As such, using the ALD method, an extremely thin film corresponding to a single-atom layer may be deposited on the board undergoing deposition, and a film may be formed to have a uniform thickness regardless of the area or surface irregularity of the board undergoing deposition. That is, a film may be formed on the board undergoing deposition that is made of a deposition material having superior adhesive or coating properties.

Thus, by stacking a junction layer 142 using any one of the deposition methods described above, including the ALD method, the adhesion between the protective layer 141 and the lower electrode 151 may be improved. In other words, the interface separation phenomenon between the protective layer 141 and the lower electrode 151 may be prevented.

Here, the junction layer 142 may also act as a barrier layer against the diffusion of oxygen, etc. This will be discussed later in more detail with reference to FIG. 9(d)-(2).

The piezoelectric elements 150 are positioned on the junction layer 142, and generate operating power that allows the ribbon part to move toward and away from the substrate 110.

The piezoelectric element 150 includes a lower electrode 151, a piezoelectric layer 152 formed on the lower electrode 150, and an upper electrode 153 formed on the piezoelectric layer 152, where the piezoelectric layer 152 contracts or expands to generate an operating power, when a predetermined voltage is supplied to the upper electrode 153 and the lower electrode 150.

Here, the electrode material used for the lower or upper electrode 151, 153 may be platinum (Pt), nickel (Ni), gold (Au), aluminum (Al), titanium (Ti), RuO2, or IrO2, etc., or a combination thereof. The lower or upper electrode 151, 153 may be formed by deposition methods such as sputtering or vacuum evaporation, etc., within the thickness range of 0.01~3 µm.

The piezoelectric layer 152 may be formed by a wet process (screenprinting, sol-gel coating, etc.) or by a dry process (sputtering, vacuum evaporation, MOCVD, vapor disposition, etc.) within the thickness range of 0.01~20.0 µm. Here, the piezoelectric layer 152 may be of a piezoelectric material such as PZT, PNN-PT, PLZT, AlN, or ZnO, etc.

Figure 8:
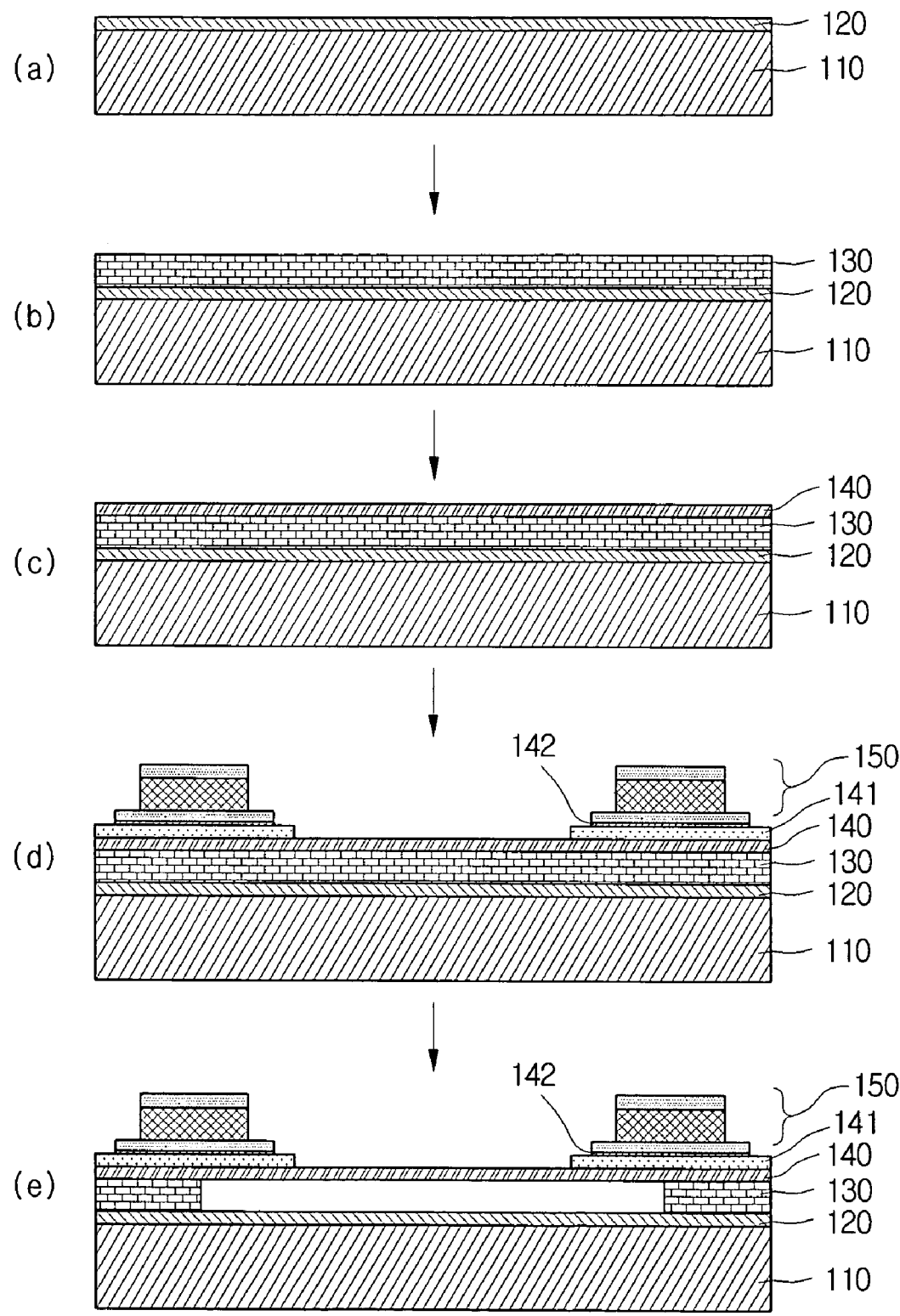
FIGS. 8(a) through 8(e) are diagrams illustrating a manufacturing process for an optical modulator based on an embodiment of the invention.

FIG. 8 is a diagram illustrating a manufacturing process for an optical modulator based on an embodiment of the invention.

Referring to FIG. 8(a), the insulation layer 120 is formed on the substrate 110. Here, the insulation layer 120 acts as an etch stop layer.

Referring to FIG. 8(b), the sacrificial layer 130 is formed on the insulation layer 120. In a subsequent process (see FIG. 8(e)), the sacrificial layer 130 may provide the operating space for the ribbon part, and all or portions of the sacrificial layer 130 may be etched such that the ribbon part is spaced apart from the insulation layer 120 by a predetermined distance.

Referring to FIG. 8(c), the ribbon layer 140 is formed on the sacrificial layer 130. In a subsequent process (see FIG. 8(e)), the ribbon layer 140 may be selectively etched to be given a particular shape (e.g. a shape having one or more holes).

Referring to FIG. 8(d), the protective layer 141 is formed on both ends of the ribbon layer 140, the junction layer 142 is formed on the protective layer 141, and the piezoelectric element 150 is formed on the junction layer 142. This will be described in more detail later with reference to FIG. 9.

Referring to FIG. 8(e), all or portions of the sacrificial layer 130 are etched by means of an etchant (where the etchant is an etchant gas or an etchant solution) to allow the ribbon part to be spaced apart by a predetermined distance from the insulation layer 120 and provide an operating space for the ribbon part.

Here, a process of selectively etching the ribbon layer 140 may precede the process of etching the sacrificial layer 130. That is, in this example, the etching process for forming a plurality of holes in the ribbon part is performed before the process of etching the sacrificial layer 130, in which case the process of etching the sacrificial layer 130 may be performed by injecting the etchant through the holes formed in the ribbon part.

FIGS. 9(d)-(1) through 9(d)-(5) are diagrams illustrating the manufacturing procedure for FIG. 8(d) in more detail. In the illustration of FIGS. 9(d)-(1) through 9(d)-(5), the sacrificial layer 130, insulation layer 120, and substrate 110 formed under the ribbon layer 140 in FIG. 8 are omitted.

Referring to FIG. 9(d)-(1), the protective layer 141 is stacked on the ribbon layer 140, after which the junction layer 142 is stacked on the protective layer 141.

Here, a material such as SiO2, etc., may be used for the protective layer 141, for which a deposition method such as LPCVD (low pressure chemical vapor deposition), etc., may be used as the method of stacking.

Also, a dielectric material from among Al2O3, TiO2, TiN, TiSiN, TaN, TaSiN, Ta2O3, Ta2O5, or WN, etc., may be used for the junction layer 142. These dielectric materials provide superior adhesion as well as superior diffusion prevention. As described above, the method of stacking the junction layer may be a deposition method, such as sputtering, E-beam evaporation, CVD (chemical vapor deposition), or ALD (atomic layer deposition).

Referring to FIG. 9(d)-(2), after stacking the lower electrode on the junction layer 142, the piezoelectric layer 152 is stacked on the lower electrode layer 151, and then the upper electrode 153 is stacked on the piezoelectric layer 152.

Here, the material used for the lower or upper electrode 151, 153 may be platinum (Pt), nickel (Ni), gold (Au), aluminum (Al), or titanium (Ti), etc., and sputtering or E-beam evaporation, etc., may be used as the method of stacking.

Also, the piezoelectric layer 152 may be of a piezoelectric material, such as PZT, PNN-PT, PLZT, AlN, or ZnO, etc. The piezoelectric layer 152 may be stacked on the lower electrode 151 by a high-temperature RTA (rapid thermal annealing) process.

Here, gases such as oxygen, etc., generated during the course of the rapid thermal annealing process also diffuse downwards of the piezoelectric layer 152, and the diffused gases become a cause of oxidation for the layers formed under the piezoelectric layer 152.

The junction layer 142, formed from Al2O3, TiSiN, TaSiN, Ta2O3, or Ta2O5, etc., may act as a barrier against the diffusion of gases such as oxygen. This is because a dielectric material, such as Al2O3, TiSiN, TaSiN, Ta2O3, and Ta2O5, etc., exits in an already oxidized or nitrified state, such that it may be unaffected by the diffusion of gases such as oxygen generated during the rapid thermal annealing process described above. In other words, since the above dielectric materials are chemically and thermally stable, they are less likely to be affected by stresses due to the diffusion of gases or heat.

Thus, by preventing oxidation due to gas diffusion, by means of the junction layer 142 using a dielectric material described above, the light diffraction property and reliability of the overall optical modulator are ensured.

Referring to FIG. 9(d)-(3), the upper electrode 153 and piezoelectric layer 152, deposited on the entire surface of the lower electrode 151 in operation of FIG. 9(d)-(2), are etched so that the upper electrode 153 and piezoelectric layer 152 may be positioned only in the predetermined portions on both ends of the lower electrode 151. Here, the etching of the upper electrode 153 and the piezoelectric layer 152 may be performed by dry etching or plasma etching, using such equipment as a dry etcher or a plasma asher, etc.

Referring to FIG. 9(d)-(4), after etching the upper electrode 153 and the piezoelectric layer 152, portions of the lower electrode 151 and the junction layer 142 are etched. Here, the etching of the lower electrode 151 and the junction layer 142 may also be performed by dry etching or plasma etching, using such equipment as a dry etcher or a plasma asher, etc.

The protective layer 141 prevents the upper surface of the ribbon layer 140 from being etched (eroded) during the etching process of the lower electrode 151 and the junction layer 142. The erosion of the upper surface of the ribbon layer 140 may deteriorate the adhesion to the upper reflective layer stacked on the ribbon part and may cause separation (peeling) at the interface between the ribbon part and the upper reflective layer. Consequently, since the erosion of the upper surface of the ribbon layer 140 has a detrimental effect on the light-reflective property of the optical modulator, having a protective layer 141 on the upper portion of the ribbon layer 140 can improve the light-reflective property of the optical modulator.

Referring to FIG. 9(d)-(5), the protective layer 141 stacked on the intermediate portion of the ribbon layer 140, i.e. the ribbon part, is etched. This process of etching a portion of the protective layer 141 is for preparing a position on the ribbon part where the upper reflective layer is to be formed.

Here, the etching of the protective layer 141 may be performed by wet etching, using a wet station, etc.

Through the procedures illustrated by operations of FIGS. 9(d)-(1) through (d)-(5) set forth above, the composition shown in FIG. 8(d) may be formed.

As in the foregoing descriptions, with an optical modulator and a manufacturing method thereof based on certain aspects of the invention, a junction layer is formed below the piezoelectric elements, so that the interface separation phenomenon between the piezoelectric elements and the protective layer may be avoided, to reduce defects in the operating properties of the piezoelectric elements.

Also, using an optical modulator and a manufacturing method thereof based on certain aspects of the invention can prevent oxidation caused by the diffusion of oxygen, etc., generated during the manufacturing process of the optical modulator, and subsequently prevent the operating property of the piezoelectric elements from being degraded.

Further, by improving the operating property of the piezoelectric elements, the degrading of the operating property of the optical modulator is avoided, and the light diffraction property and reliability of the overall optical modulator can be maximized.

While the present invention has been described with reference to particular embodiments, it is to be appreciated that various changes and modifications may be made by those skilled in the art without departing from the spirit and scope of the invention, as defined by the appended claims and their equivalents.

What is claimed is:

1. An optical modulator comprising:
   a substrate;
   an insulation layer positioned on the substrate;
   a ribbon layer positioned with an intermediate portion thereof spaced apart from the insulation layer by a predetermined distance;
   a protective layer positioned on both end portions of the ribbon layer;
   a junction layer positioned on the protective layer, the junction layer having an adhesive property and configured to prevent a diffusion of gas; and
   a piezoelectric element joined with the protective layer by way of the junction layer interposed in-between and configured to move the intermediate portion of the ribbon layer toward and away from the substrate.

2. The optical modulator of claim 1:
   further comprising a sacrificial layer disposed between the insulation layer and the ribbon layer and configured to support the ribbon layer,
   wherein a portion of the sacrificial layer located at an intermediate portion of the ribbon layer is removed, thereby spacing the intermediate portion of the ribbon layer from the insulation layer by a predetermined distance.

3. The optical modulator of claim 1, wherein the piezoelectric element comprises:
   a lower electrode;
   a piezoelectric layer positioned on the lower electrode; and
   an upper electrode positioned on the piezoelectric layer,
   wherein the piezoelectric layer is configured to contract or expand in correspondence to a predetermined voltage to generate an operating power for moving the intermediate portion of the ribbon layer toward and away from the substrate.

4. The optical modulator of claim 1, wherein the junction layer comprises at least one material selected from a group consisting of Al2O3, TiO2, TiN, TiSiN, TaN, TaSiN, Ta2O3, $Ta2O_5$, and WN.

5. The optical modulator of claim 4, wherein the junction layer is configured to prevent a diffusion of oxygen.

* * * * *